(12) United States Patent
Danilov et al.

(10) Patent No.: US 10,374,637 B1
(45) Date of Patent: Aug. 6, 2019

(54) SYSTEM AND METHOD FOR UNBALANCED LOAD HANDLING WITH DISTRIBUTED ERASURE CODING

(71) Applicant: EMC IP Holding Company LLC, Hopkinton, MA (US)

(72) Inventors: Mikhail Danilov, Saint Petersburg (RU); Konstantin Buinov, Prague (CZ); Alexander Rakulenko, Seattle, WA (US); Andrey Kurilov, Vsevolozhsk (RU); Kirill Gusakov, Saint Petersburg (RU)

(73) Assignee: EMC IP Holding Company LLC, Hopkinton, MA (US)

( * ) Notice: Subject to any disclaimer, the term of this patent is extended or adjusted under 35 U.S.C. 154(b) by 40 days.

(21) Appl. No.: 15/582,167

(22) Filed: Apr. 28, 2017

(51) Int. Cl.
*H03M 13/00* (2006.01)
*H03M 13/29* (2006.01)

(52) U.S. Cl.
CPC ....... *H03M 13/293* (2013.01); *H03M 13/611* (2013.01)

(58) Field of Classification Search
None
See application file for complete search history.

(56) References Cited

U.S. PATENT DOCUMENTS

| | | | |
|---|---|---|---|
| 2006/0143508 A1* | 6/2006 | Mochizuki | G06F 3/0613 714/6.2 |
| 2014/0064048 A1* | 3/2014 | Cohen | G06F 3/0613 369/47.15 |
| 2015/0370656 A1* | 12/2015 | Tsafrir | G06F 11/1088 714/6.3 |
| 2016/0011935 A1* | 1/2016 | Luby | G06F 3/0617 714/6.2 |
| 2016/0011936 A1* | 1/2016 | Luby | G06F 3/0617 714/6.2 |
| 2017/0206135 A1* | 7/2017 | Zeng | G06F 11/2094 |

* cited by examiner

*Primary Examiner* — Daniel F. McMahon
(74) *Attorney, Agent, or Firm* — Womble Bond Dickinson (US) LLP

(57) ABSTRACT

A method for creating distributed erasure coding chunks in a distributed storage system with unbalanced load is disclosed. The operations comprise configuring the distributed storage system into at least k+m zones, wherein each zone accumulates at least 1 primary backup chunks of original data chunks replicated from different remote zones, and wherein l<k, and preparing the distributed storage system for recovery from a failure of 1 to m zones of the at least k+m zones including, in each zone, encoding the at least l primary backup chunks to create m coding chunks using an erasure coding having parameters k+m, wherein in each zone in which fewer than k primary backup chunks have been accumulated, at most k−l predetermined virtual chunks are used to create partial coding chunks.

18 Claims, 11 Drawing Sheets

SYSTEM AND METHOD FOR UNBALANCED LOAD HANDLING WITH DISTRIBUTED ERASURE CODING

CROSS REFERENCE TO RELATED APPLICATION

This Application is related to U.S. patent application Ser. No. 15/390,415 filed on Dec. 23, 2016, entitled "DATA PROTECTION MANAGEMENT FOR DISTRIBUTED STORAGE," the content and teachings of which application is incorporated herein by reference in its entirety.

FIELD OF THE INVENTION

Embodiments of the disclosure are related to data storage, and more particularly, to a method, apparatus, and system for data recovery and deletion in a remote replication cloud setup.

BACKGROUND

Cloud-based data storage solutions are becoming increasingly popular. One example is the Elastic Cloud Storage (ECS) service provided by Dell EMC. Latest trends in software architecture and development are used in these solutions to achieve outstanding scalability, availability, and serviceability.

The U.S. patent application Ser. No. 15/390,415 filed on Dec. 23, 2016, entitled "DATA PROTECTION MANAGEMENT FOR DISTRIBUTED STORAGE" describes a method for data protection via distributed erasure coding. The method allows a distributed storage to recover data from two or more failures. However, with this known method, good results are assured only when load of a distributed storage system is perfectly balanced. If not, capacity overhead associated with distributed data protection may grow unacceptably high.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
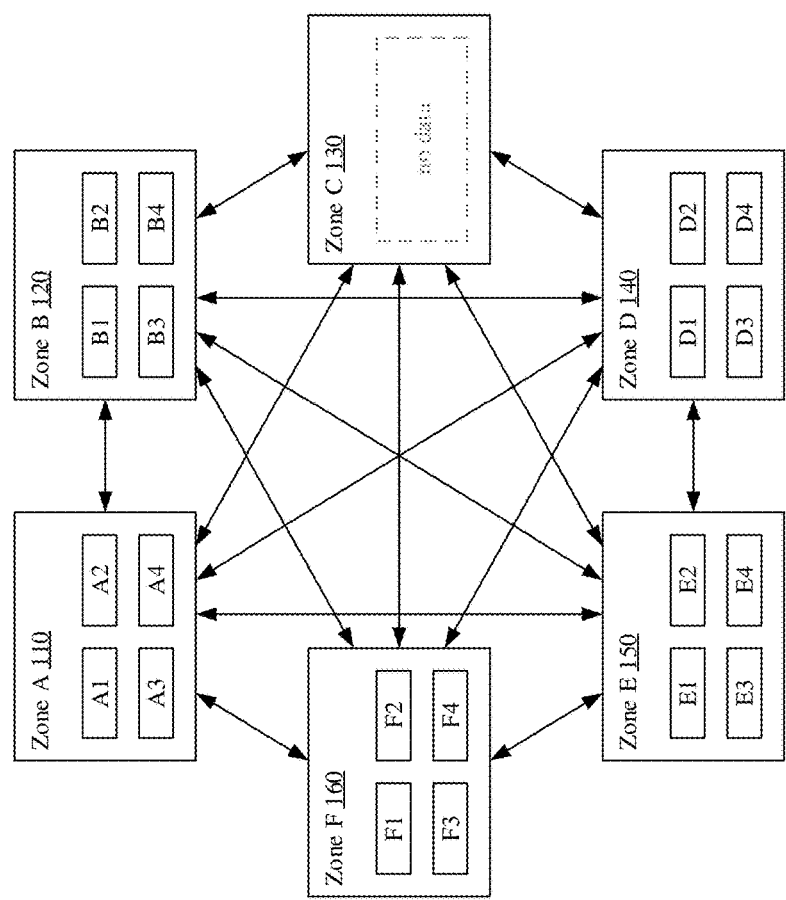
FIG. 1 is a block diagram illustrating an example distributed storage system with an under-loaded zone.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Embodiments of the disclosure relate to unbalanced load handling with distributed erasure coding in a distributed cloud storage system.

Cloud-based data storage solutions are becoming increasingly popular. In a cloud-based data storage system, data may be protected with data redundancy provided with remote replication. In short, remote replication provides enhanced protection against site failures by having multiple copies of the data, i.e., a primary copy of the data at the original site and one or more secondary copies of the data at one or more remote sites. In one embodiment, the remote replication may work at the data chunk level. The sites may be geographically distributed, e.g., on different continents, and may also be referred to as zones hereinafter. In one embodiment, a cloud storage system may support up to 8 zones. Further, the XOR (exclusive or) technique may be used with remote replication to reduce capacity overhead. The XOR technique is described in U.S. Provisional Patent Application Ser. No. 61/988,603 filed on May 5, 2014, entitled "DISTRIBUTED DATA STORAGE MANAGEMENT" and U.S. patent application Ser. No. 14/319,349 filed on Jun. 30, 2014, entitled "DISTRIBUTED DATA STORAGE MANAGEMENT," the content and teachings of which applications are incorporated herein by reference in their entirety.

In one embodiment, all disk space is partitioned into a set of blocks of a fixed size called chunks. The chunks size may be 128 Megabytes (MBs). All user data may be stored in these chunks and the chunks may be shared by different user data objects. One chunk may contain segments of several user objects. Chunk content may be modified in append-only mode. When a chunk becomes full enough, it may be sealed. Content of sealed chunks may be immutable.

The use of remote replication recovery together with the XOR technique enables a distributed storage system to recover data from a failure of a single zone and/or cluster and/or chunk in the distributed storage system. It is not sufficient to recover data from a dual failure or from more complicated failures.

U.S. patent application Ser. No. 15/390,415 filed on Dec. 23, 2016, entitled "DATA PROTECTION MANAGEMENT FOR DISTRIBUTED STORAGE" describes a method for data protection via distributed erasure coding, which enables a distributed storage system to recover data from m failures. According to this method, data fragments for encoding (i.e., backup copies of chunks) are produced by different geographically distributed zones. In case there is one or more zones that fail to keep pace and produces fewer chunks than other zones, backup copies of chunks produced by other zones occupy capacity until there is a complete set of backup copies of chunks needed for encoding. For example, if a 10+2 scheme is used, the situation leads to a 200% capacity overhead per chunk (2 backup copies) instead of a target of 20% (2 coding chunks for each 10 data chunks). Thus, there is room for improving the distributed erasure coding for unbalanced load across zones.

In one embodiment, a distributed storage system may produce and interchange between its zones m partial coding chunks using a k+m erasure coding scheme when one or more zones produce not enough data chunks. Partial coding chunks are produced for l data chunks, where l<k. During encoding the missing k−l data chunks are replaced by predetermined virtual (or fake) chunks (e.g., chunks filled with zeroes, ones, or any known pattern of data). When encoding is finished and the resulting partial coding chunks are distributed across different zones, the backup copies of source data chunks can be deleted. This assures significant reduction of capacity overhead per chunk when l is close to k. For instance, if a 10+2 scheme is used and l equals to 9, the capacity overhead reduction from 200% to 22.2%, which is close to target 20%, can be achieved.

If load imbalance is constant, partial coding chunks produced by zones may stay partial. Data chunks from under-loaded zones can be encoded with new chunks produced by normally-loaded zones.

If load imbalance is temporary, new data chunks from under-loaded zones may be used to make partial coding chunks complete. This could be done using a known incremental encoding technique described in Russian Patent Application Serial No. RU2016125850 filed on Jun. 29, 2016, entitled "INCREMENTAL ERASURE CODING FOR STORAGE SYSTEMS," the content and teachings of which application is incorporated herein by reference in its entirety. However, some zone may need to collect all data and partial coding chunks locally in order to complete the encoding. Because backup copies of remote chunks may have been deleted and partial coding chunks have been distributed between zones, the zone may need to read the chunks from remote zones once again. For the 10+2 scheme and chunks of 128 MB size, the zone may need to read up to 1.4 Gigabytes (GB) of data from remote zones and this can place excessive burden on the network. Therefore, in one embodiment, assuming there are m partial coding chunks stored to up to m zones, m backup copies of a data chunk may be replicated from an under-loaded zone to the remote zones that contain m partial coding chunks that miss the data chunk. Each remote zone may update a partial coding chunk(s) it contains using the backup copy received. It should be appreciated that this is possible because coding chunks/fragments are calculated independently. When a partial coding chunk is updated using the last missing data chunk, the coding chunk becomes complete.

Referring to FIG. 1, a block diagram illustrating an example distributed storage system 100 with an under-loaded zone is shown. FIG. 1 shows 6 zones (Zone A 610, Zone B 620, Zone C 630, Zone D 640, Zone E 650, and Zone F 660) and there is a requirement for the distributed storage system to recover data from 2 failures of zones and/or clusters and/or chunks. A 4+2 erasure coding scheme (i.e. 2 coding chunks are created for 4 data chunks) is used.

The system 100 is almost identical to one described in U.S. patent application Ser. No. 15/390,415. The only difference is that Zone C 130 is under-loaded. In other words, Zone C 130 has created no data chunks, while other zones have created 4 data chunks each.

Figure 2:
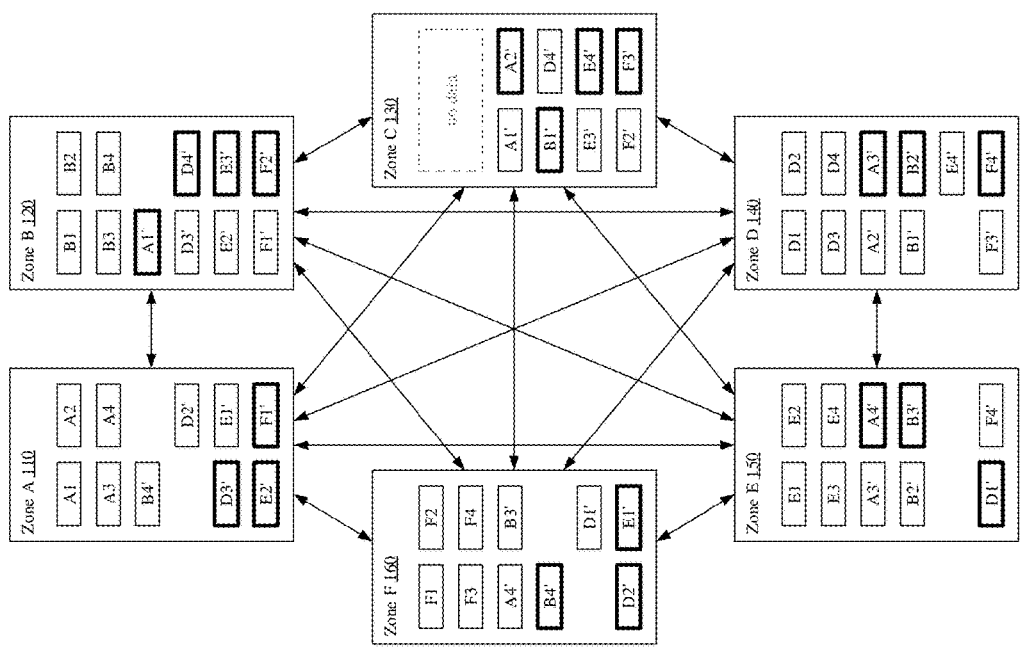
FIG. 2 is a block diagram illustrating an example distributed storage system with chunks replicated.

Referring to FIG. 2, a block diagram illustrating an example distributed storage system 100 with chunks replicated is shown. As shown in FIG. 2, each normally loaded zone protects its data chunks by creating two backup copies (one primary and one normal) at remote zones. In FIG. 2, the primary backup copy of each chunk is drawn with a bold line. Zones A, B, D, E, and F 110, 120, 140, 150, 160 have gaps because Zone C 130 has no data chunks to replicate to them. Only Zone B 120 and Zone C 130 have complete sets of 4 primary backup copies of remote data chunks. Therefore, Zone B 120 and Zone C 130 can perform normal encoding operation and produce complete coding chunks. As for the other zones, they contain 3 primary backup copies of remote data chunks each. These zones may produce partial coding chunks, as described hereinafter.

Figure 3:
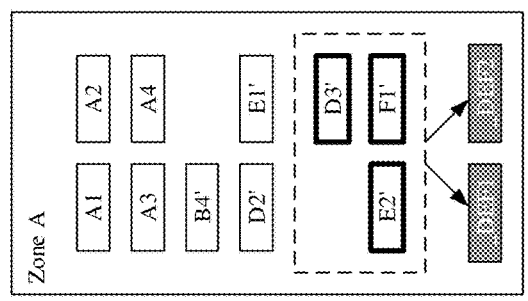
FIG. 3 is a block diagram illustrating an example Zone A creating partial coding chunks.

Referring to FIG. 3, a block diagram illustrating an example Zone A 110 creating partial coding chunks is shown. Zone A 110 stores only three primary backup chunks that come from different remote zones. Zone A 110 may perform encoding using these backup chunks as data fragments. During encoding the missing data chunks may be replaced by predetermined virtual (or fake) chunks (e.g., chunks filled with zeroes, ones, or any known pattern of data). The two coding chunks created are partial because Zone A misses a primary backup chunk from Zone C. Therefore, Zone A 110 may produce partial coding chunks _DEF1 and _DEF2 (complete coding chunks would be CDEF1 and CDEF2, respectively), where the underscore symbol indicates that the coding chunks are incomplete and there is one source data chunk missing. Zones D, E, and F 140, 150, 160 may produce their partial coding chunks similarly. It should be noted that only primary backup chunks are used for encoding. Normal backup chunks are ignored.

Figure 4:
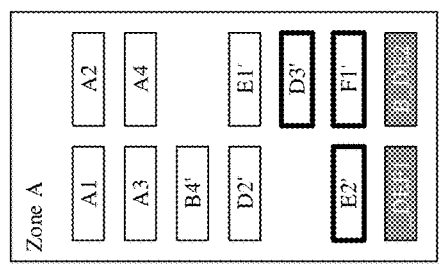
FIG. 4 is a block diagram illustrating an example Zone A interchanging coding chunks.

Referring to FIG. 4, a block diagram illustrating an example Zone A 110 interchanging coding chunks is shown. The complete and partial coding chunks created need to be stored across the distributed storage system. In one embodiment, the first coding chunk stays at the zone where it has been created. The second coding chunk is moved clockwise. FIG. 4 shows that the partial coding chunk_DEF1 remains at Zone A 110, whereas the partial coding chunk_DEF2 has moved to Zone B 120. Zone A 110 also stores the partial coding chunk B_DE2 produced by Zone F 160, which is the zone next to Zone A 110 counterclockwise.

Figure 5:
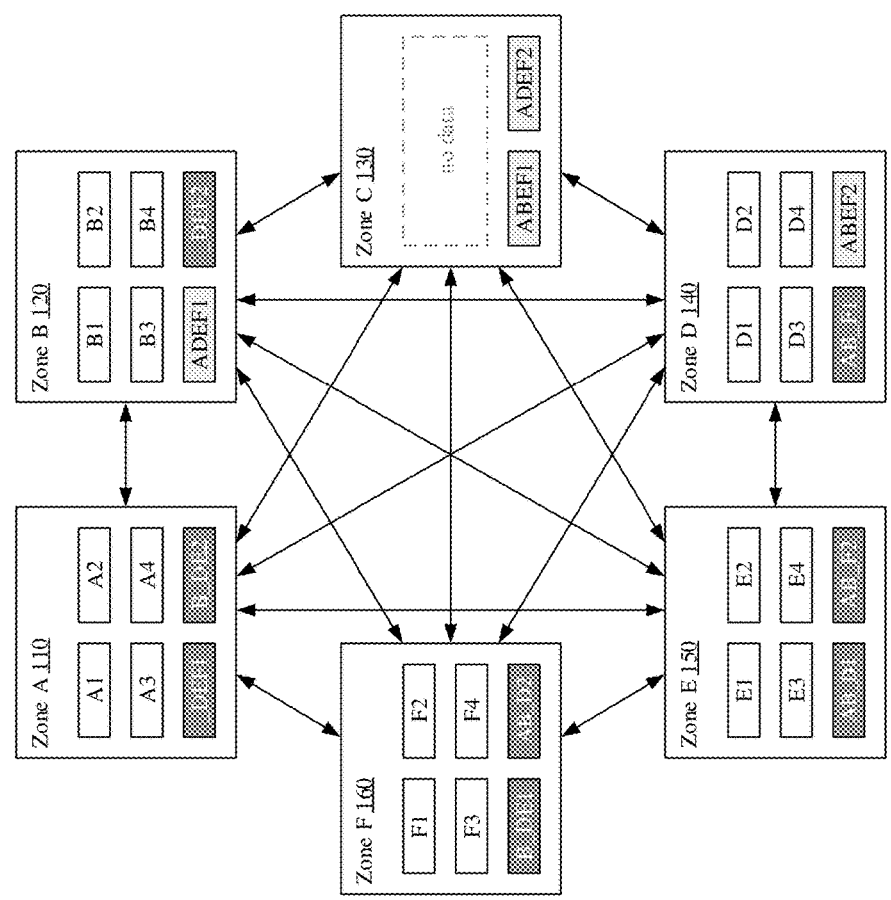
FIG. 5 is a block diagram illustrating an example distributed storage system with an intermediate data layout.

Referring to FIG. 5, a block diagram illustrating an example distributed storage system 100 with an intermediate data layout is shown. After the partial and complete coding chunks have been distributed among the zones based on the scheme described above, all the backup chunks may be safely deleted. Therefore, each zone may store two complete and/or partial coding chunks. In this example, the capacity overhead associated with replication is reduced by a factor of 3.3 (12 complete and partial coding chunks instead of 40 backup chunks).

Figure 6:
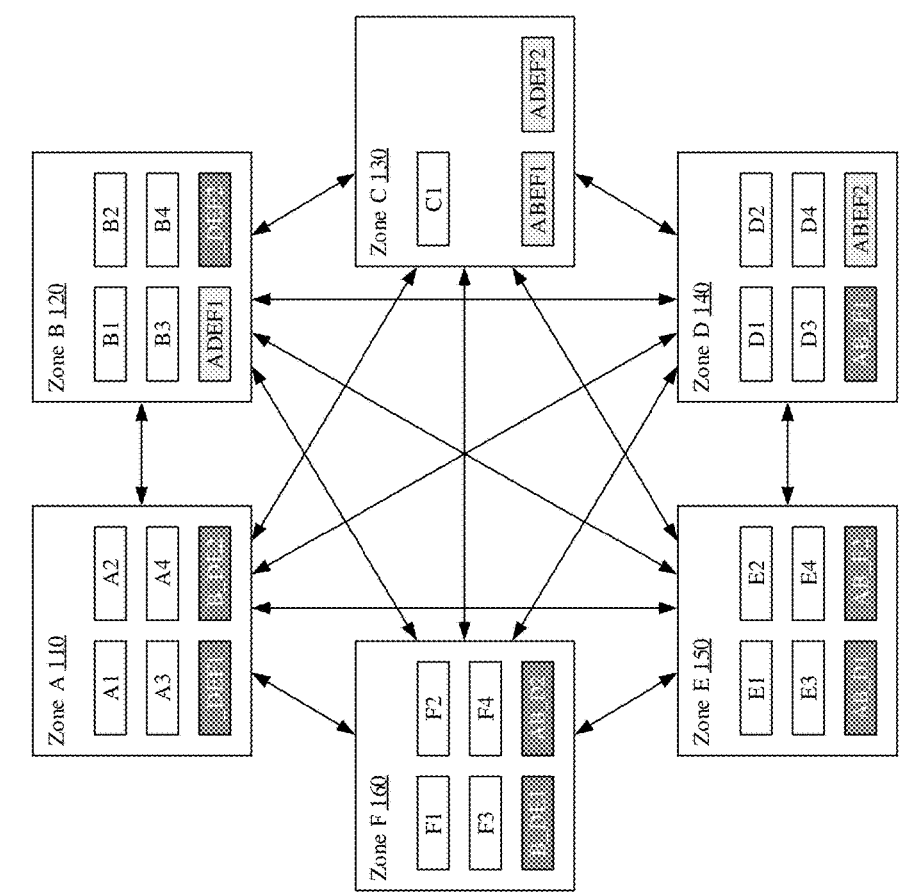
FIG. 6 is a block diagram illustrating an example distributed storage system with a new chunk created in Zone C.

Referring to FIG. 6, a block diagram illustrating an example distributed storage system 100 with a new chunk created in Zone C is shown. The only new chunk, Chunk C1 in Zone C 130, may be added to one of existing incomplete protection groups, AB_F, AB_D, B_DE, or _DEF.

Figure 7:
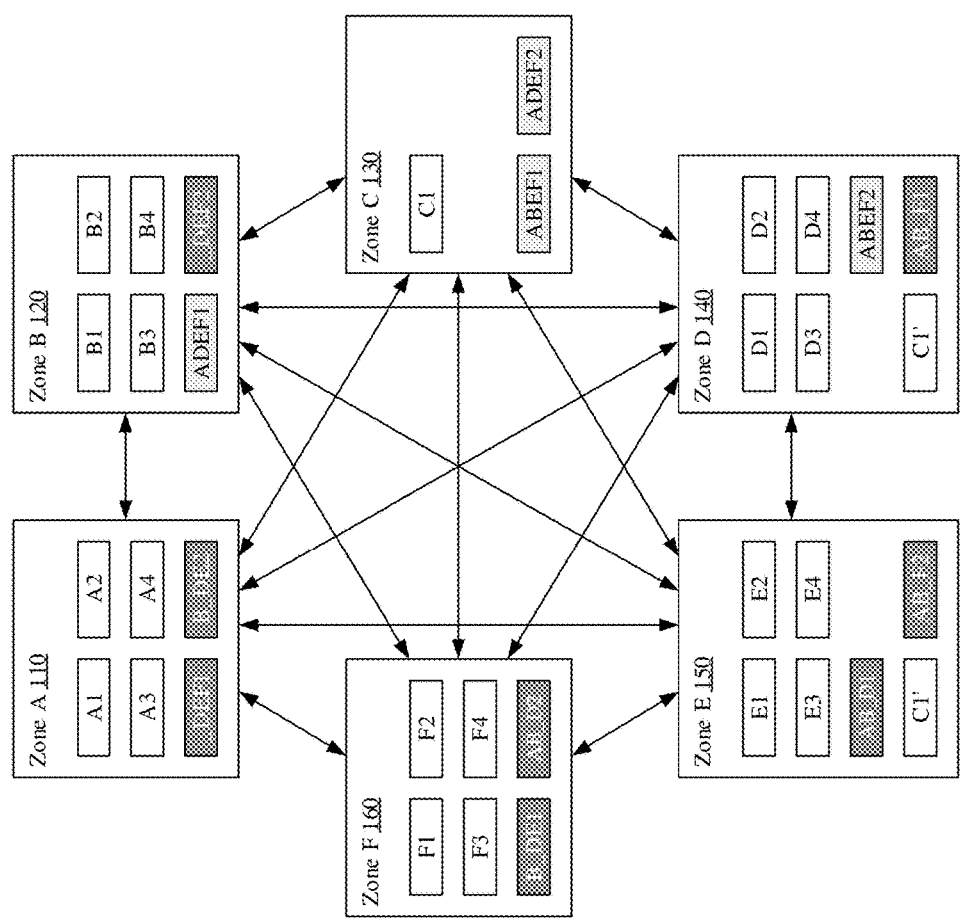
FIG. 7 is a block diagram illustrating an example distributed storage system with replication of Chunk C1.

Referring to FIG. 7, a block diagram illustrating an example distributed storage system 100 with replication of Chunk C1 is shown. In one embodiment, a decision is made to add Chunk C1 to the AB_F incomplete protection group. The decision is illustrative and does not limit the disclosure. Other incomplete protection groups may also be chosen in other embodiments. In order to reduce inter-zone network traffic, Zone C 130 may replicate Chunk C1 to the zones that store partial coding chunks for the incomplete protection group chosen. These are Zone D 140, which stores the partial coding chunk AB_F1, and Zone E, which stores the partial coding chunk AB_F2. It should be noted that at this point both backup copies of Chunk C1 are used for encoding, so they are both primary.

Figure 8:
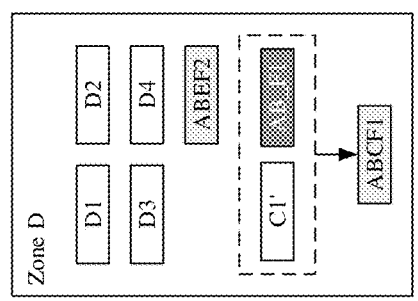
FIG. 8 is a block diagram illustrating an example Zone D completing the encoding for the partial coding chunk.

Referring to FIG. 8, a block diagram illustrating an example Zone D 140 completing the encoding for the partial coding chunk is shown. Zone D 140 may use the backup Chunk C1 received to complete encoding for the partial coding chunk AB_F1 it stores. In particular, Zone D 140 may update content of the partial coding chunk AB_F1 using content of the Chunk C1 with the incremental encoding technique. Since AB_F1 misses one chunk only, the resulting coding chunk ABCF1 is complete. It should be appreciated that Zone E 150 may update its partial coding chunk AB_F2 similarly. Since the partial coding chunks are already distributed between zones, no coding chunk interchange is required. Of course, after Zone D 140 and Zone E 150 finish processing C1's backup copies, the copies and the partial coding chunks can be deleted.

Figure 9:
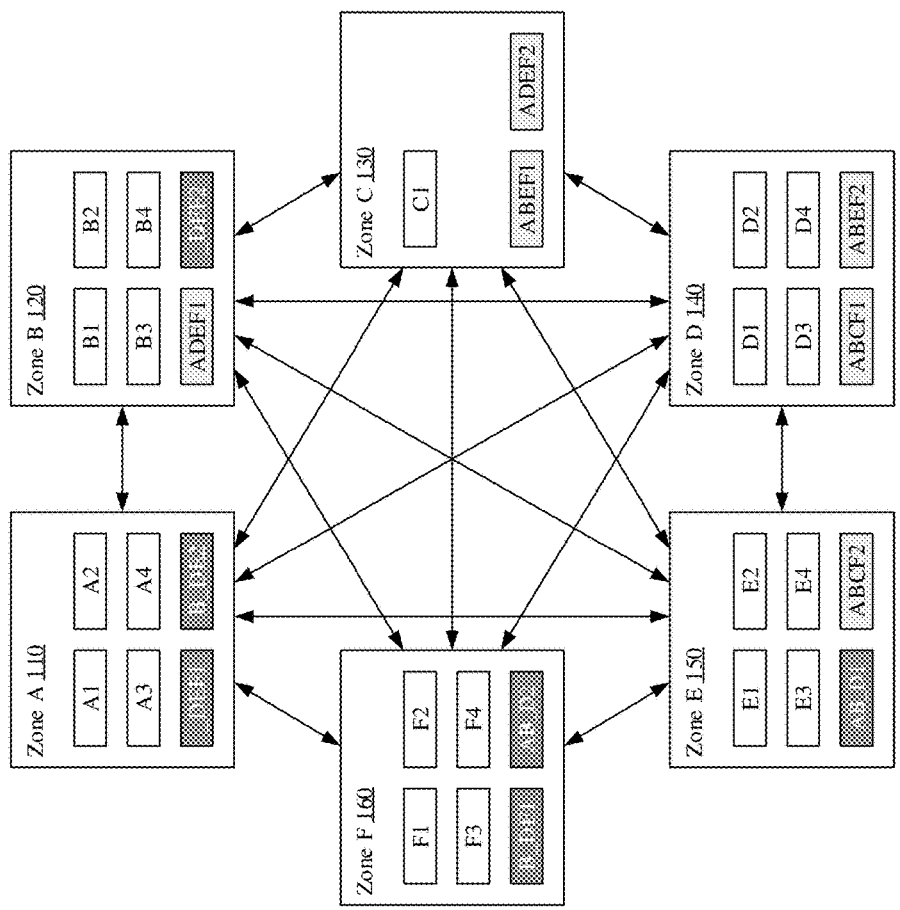
FIG. 9 is a block diagram illustrating an example distributed storage system with a final layout.

Referring to FIG. 9, a block diagram illustrating an example distributed storage system 100 with a final layout is shown. Compared to the intermediate data layout illustrated in FIG. 5, FIG. 9 shows that Zone C 130 contains Chunk C1, and Zone D 140 and Zone E 150 contain complete coding chunks ABCF1 and ABCF2 instead of partial coding chunks AB_F1 and AB_F2, respectively.

If Zone C 130 produces more chunks, they can be protected together with the remaining incomplete protection groups.

It should be appreciated that FIGS. 1-9 and the associated description hereinafter are illustrative only, and do not limit the disclosure. The parameters associated with the distributed storage system (e.g., the number of zones, parameters m, k, etc.) do not limit the disclosure.

Figure 10:
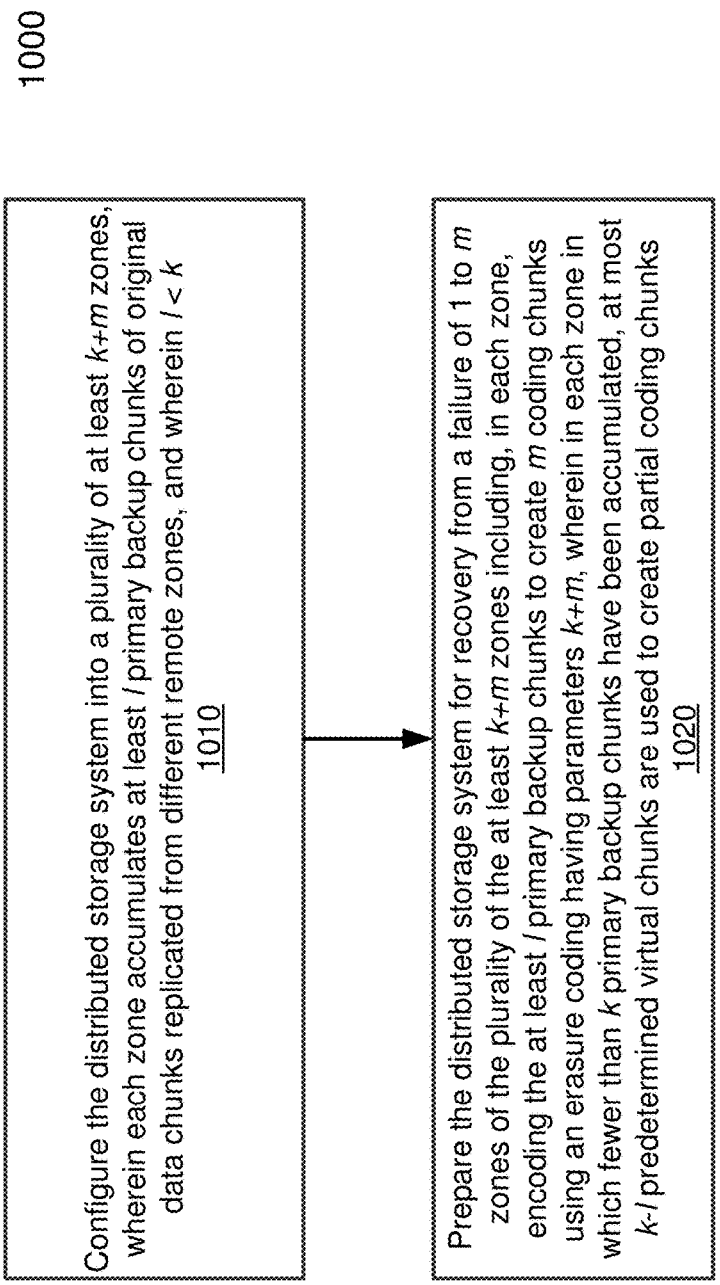
FIG. 10 is a flowchart illustrating an example method for creating distributed erasure coding chunks in a distributed storage system with unbalanced load.

Referring to FIG. 10, a flowchart illustrating an example method 1000 for creating distributed erasure coding chunks in a distributed storage system with unbalanced load is shown. At block 1010, the distributed storage system may be configured into a plurality of at least k+m zones, wherein each zone accumulates at least l primary backup chunks of original data chunks replicated from different remote zones, and wherein l<k. At block 1020, the distributed storage system may be prepared for recovery from a failure of 1 to m zones of the plurality of the at least k+m zones including, in each zone, encoding the at least l primary backup chunks to create m coding chunks using an erasure coding having parameters k+m, wherein in each zone in which fewer than k primary backup chunks have been accumulated, at most predetermined k-l virtual chunks are used to create partial coding chunks.

The preparing the distributed storage system may further include, in each zone: retaining one of the m coding chunks; distributing to a different one of any m-1 remote zones each of the m-1 coding chunks not retained; and deleting any primary backup chunks to reduce storage overhead.

When a new data chunk is created at a zone, the new data chunk may be added to an incomplete protection group comprising m partial coding chunks using the incremental encoding technique.

Unavailable chunks from a failure of 1 to m zones may be recovered. The recovery may include performing, in each of the zones unaffected by the failure, any one or more of: identifying any of the still available coding chunks created and retained by the zone, and retrieving any of the still available coding chunks distributed to the zone from another zone, and creating local copies of any of the still available original data chunks from which the still available coding chunks were created; and reconstructing as many unavailable chunks as possible from the still available coding chunks and the still available original data chunks.

The plurality of at least k+m zones into which the distributed storage system may be configured may be distributed across a geographical area. Further, the distributed storage system may be a cloud-based storage system accessible over an inter-network.

Method 1000 may be performed by processing logic that includes hardware (e.g. circuitry, dedicated logic, etc.), software (e.g., embodied on a non-transitory computer readable medium), or a combination thereof. For example, method 1000 may be performed by processors 1501 of FIG. 11. Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Therefore, according to the embodiments of the disclosure herein, a distributed storage system produces and interchanges between its zones m partial and/or complete coding chunks using a k+m erasure coding scheme when one or more zones produce not enough data chunks. Partial coding chunks are produced for l data chunks, where l<k. During encoding the missing k-l data chunks are replaced by predetermined virtual (or fake) chunks (e.g., chunks filled with zeroes, ones, or any known pattern of data). When encoding is finished and the resulting partial coding chunks are distributed across different zones, the backup copies of source data chunks can be deleted. This assures significant reduction of capacity overhead per chunk when l is close to k compared to the conventional method described in U.S. patent application Ser. No. 15/390, entitled "DATA PROTECTION MANAGEMENT FOR DISTRIBUTED STORAGE."

Figure 11:
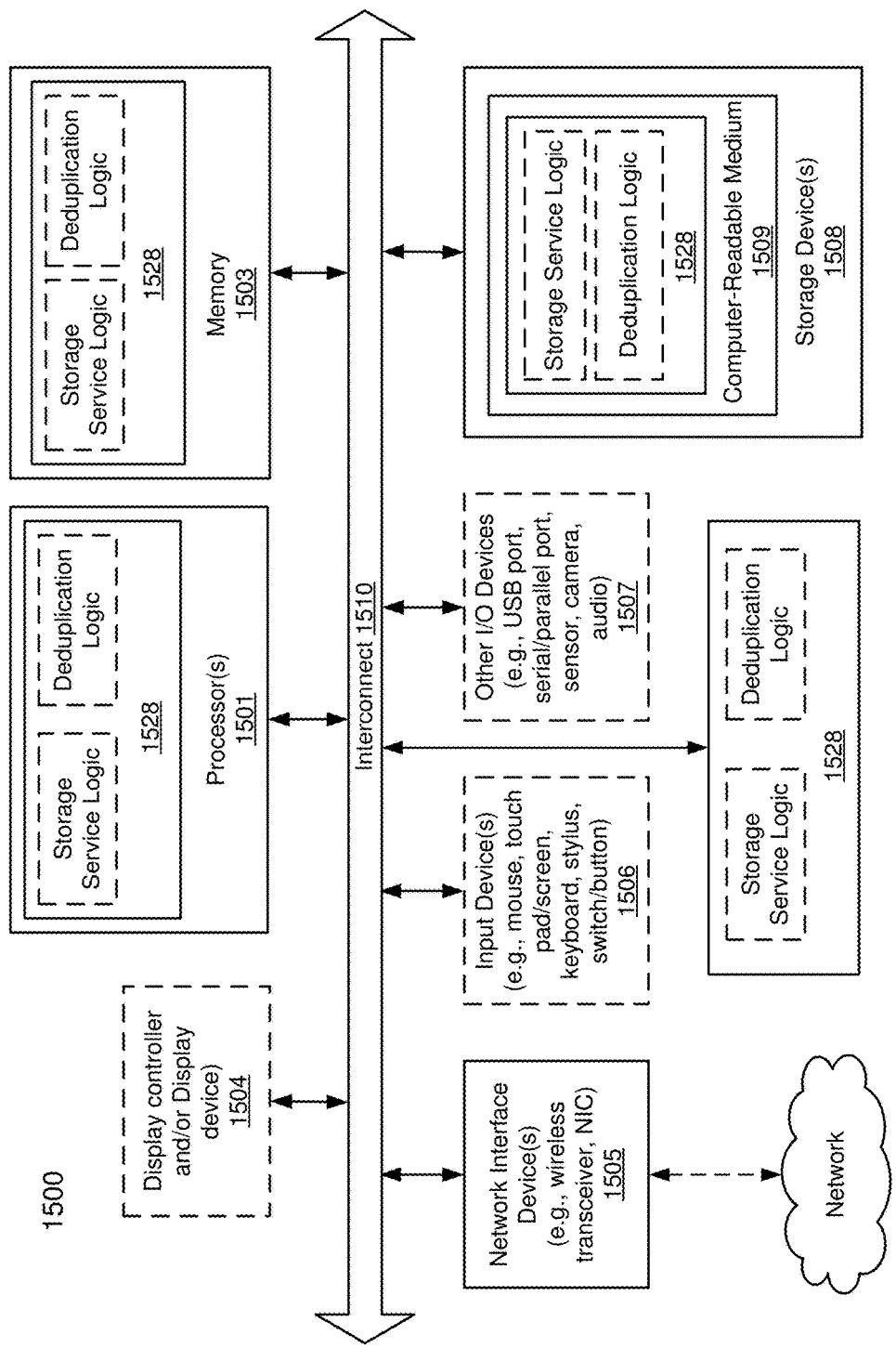
FIG. 11 is a block diagram illustrating an example of a data processing system which may be used with one embodiment of the disclosure.

FIG. 11 is a block diagram illustrating an example of a data processing system 1500 which may be used with one embodiment of the disclosure. For example, system 1500 may represents any of data processing systems described above performing any of the processes or methods described above. System 1500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 1500 is intended to show a high level view of many components of the computer system. However, it is to be understood that additional components may be present in certain implementations and furthermore, different arrangement of the components shown may occur in other implementations. System 1500 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 1500 includes processor 1501, memory 1503, and devices 1505-1508 via a bus or an interconnect 1510. Processor 1501 may represent a single processor or multiple processors with a single processor core or multiple processor cores included therein. Processor 1501 may represent one or more general-purpose processors such as a microprocessor, a central processing unit (CPU), or the like. More particularly, processor 1501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 1501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 1501, which may be a low power multi-core processor socket such as an ultra-low voltage processor, may act as a main processing unit and central hub for communication with the various components of the system. Such processor can be implemented as a system on chip (SoC). Processor 1501 is configured to execute instructions for performing the operations and steps discussed herein. System 1500 may further include a graphics interface that communicates with optional graphics subsystem 1504, which may include a display controller, a graphics processor, and/or a display device.

Processor 1501 may communicate with memory 1503, which in one embodiment can be implemented via multiple memory devices to provide for a given amount of system memory. Memory 1503 may include one or more volatile storage (or memory) devices such as random access memory (RAM), dynamic RAM (DRAM), synchronous DRAM (SDRAM), static RAM (SRAM), or other types of storage devices. Memory 1503 may store information including sequences of instructions that are executed by processor 1501, or any other device. For example, executable code and/or data of a variety of operating systems, device drivers, firmware (e.g., input output basic system or BIOS), and/or applications can be loaded in memory 1503 and executed by processor 1501. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 1500 may further include IO devices such as devices 1505-1508, including network interface device(s) 1505, optional input device(s) 1506, and other optional IO device(s) 1507. Network interface device 1505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 1506 may include a mouse, a touch pad, a touch sensitive screen (which may be integrated with display device 1504), a pointer device such as a stylus, and/or a keyboard (e.g., physical keyboard or a virtual keyboard displayed as part of a touch sensitive screen). For example, input device 1506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 1507 may include an audio device. An audio device may include a speaker and/or a microphone to facilitate voice-enabled functions, such as voice recognition, voice replication, digital recording, and/or telephony functions. Other IO devices 1507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. Devices 1507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 1510 via a sensor hub (not shown), while other devices such as a keyboard or thermal sensor may be controlled by an embedded controller (not shown), dependent upon the specific configuration or design of system 1500.

To provide for persistent storage of information such as data, applications, one or more operating systems and so forth, a mass storage (not shown) may also couple to processor 1501. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 1501, e.g., via a serial peripheral interface (SPI). This flash device may provide for non-volatile storage of system software, including a basic input/output software (BIOS) as well as other firmware of the system.

Storage device 1508 may include computer-accessible storage medium 1509 (also known as a machine-readable storage medium or a computer-readable medium) on which is stored one or more sets of instructions or software (e.g., module, unit, and/or logic 1528) embodying any one or more of the methodologies or functions described herein.

Module/unit/logic 1528 may also reside, completely or at least partially, within memory 1503 and/or within processor 1501 during execution thereof by data processing system 1500, memory 1503 and processor 1501 also constituting machine-accessible storage media. Module/unit/logic 1528 may further be transmitted or received over a network via network interface device 1505.

Computer-readable storage medium 1509 may also be used to store the some software functionalities described above persistently. While computer-readable storage medium 1509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Module/unit/logic 1528, components and other features described herein can be implemented as discrete hardware components or integrated in the functionality of hardware components such as ASICS, FPGAs, DSPs or similar devices. In addition, module/unit/logic 1528 can be implemented as firmware or functional circuitry within hardware devices. Further, module/unit/logic 1528 can be implemented in any combination hardware devices and software components.

Note that while system 1500 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the disclosure.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method for creating distributed erasure coding chunks in a distributed storage system with unbalanced load, comprising:
   configuring the distributed storage system into at least k+m zones, wherein each zone accumulates at least 1 primary backup chunks of original data chunks replicated from different remote zones, and wherein l<k, and
   preparing the distributed storage system for recovery from a failure of 1 to m zones of the at least k+m zones including, in each zone, encoding the at least 1 primary backup chunks to create m coding chunks using an erasure coding having parameters k+m, wherein in each zone in which fewer than k primary backup chunks have been accumulated, at most k−1 predetermined virtual chunks are used to create partial coding chunks.

2. The method of claim 1, wherein preparing the distributed storage system further includes, in each zone:
   retaining one of the m coding chunks;
   distributing to a different one of any m−1 remote zones each of the m−1 coding chunks not retained; and
   deleting any primary backup chunks to reduce storage overhead.

3. The method of claim 1, further comprising:
   recovering unavailable chunks from a failure of 1 to m zones including performing, in each of the zones unaffected by the failure, any one or more of:
   identifying any of still available coding chunks created and retained by the zone, and
   retrieving any of the still available coding chunks distributed to the zone from another zone, and
   creating local copies of any of still available original data chunks from which the still available coding chunks were created; and
   reconstructing as many unavailable chunks as possible from the still available coding chunks and the still available original data chunks.

4. The method of claim 1, further comprising adding a new data chunk to an incomplete protection group comprising m partial coding chunks.

5. The method of claim 1, wherein the plurality of at least k+m zones into which the distributed storage system is configured is distributed across a geographical area.

6. The method of claim 1, wherein the distributed storage system is a cloud-based storage system accessible over an inter-network.

7. A non-transitory machine-readable medium having instructions stored therein which, when executed by a processor, cause the processor to perform storage operations, the operations comprising:
configuring a distributed storage system into at least k+m zones, wherein each zone accumulates at least l primary backup chunks of original data chunks replicated from different remote zones, and wherein l<k, and
preparing the distributed storage system for recovery from a failure of 1 to m zones of the at least k+m zones including, in each zone, encoding the at least l primary backup chunks to create m coding chunks using an erasure coding having parameters k+m, wherein in each zone in which fewer than k primary backup chunks have been accumulated, at most k-l predetermined virtual chunks are used to create partial coding chunks.

8. The non-transitory machine-readable medium of claim 7, wherein preparing the distributed storage system further includes, in each zone:
retaining one of the m coding chunks;
distributing to a different one of any m-1 remote zones each of the m-1 coding chunks not retained; and
deleting any primary backup chunks to reduce storage overhead.

9. The non-transitory machine-readable medium of claim 7, further comprising:
recovering unavailable chunks from a failure of 1 to m zones including performing, in each of the zones unaffected by the failure, any one or more of:
identifying any of still available coding chunks created and retained by the zone, and
retrieving any of the still available coding chunks distributed to the zone from another zone, and
creating local copies of any of still available original data chunks from which the still available coding chunks were created; and
reconstructing as many unavailable chunks as possible from the still available coding chunks and the still available original data chunks.

10. The non-transitory machine-readable medium of claim 7, wherein the operations further comprise adding a new data chunk to an incomplete protection group comprising m partial coding chunks.

11. The non-transitory machine-readable medium of claim 7, wherein the plurality of at least k+m zones into which the distributed storage system is configured is distributed across a geographical area.

12. The non-transitory machine-readable medium of claim 7, wherein the distributed storage system is a cloud-based storage system accessible over an inter-network.

13. A data processing system, comprising:
a processor; and
a memory coupled to the processor storing instructions which, when executed by the processor, cause the processor to perform storage operations, the operations including
configuring a distributed storage system into at least k+m zones, wherein each zone accumulates at least l primary backup chunks of original data chunks replicated from different remote zones, and wherein l<k, and
preparing the distributed storage system for recovery from a failure of 1 to m zones of the at least k+m zones including, in each zone, encoding the at least l primary backup chunks to create m coding chunks using an erasure coding having parameters k+m, wherein in each zone in which fewer than k primary backup chunks have been accumulated, at most k-l predetermined virtual chunks are used to create partial coding chunks.

14. The data processing system of claim 13, wherein preparing the distributed storage system further includes, in each zone:
retaining one of the m coding chunks;
distributing to a different one of any m-1 remote zones each of the m-1 coding chunks not retained; and
deleting any primary backup chunks to reduce storage overhead.

15. The data processing system of claim 13, further comprising:
recovering unavailable chunks from a failure of 1 to m zones including performing, in each of the zones unaffected by the failure, any one or more of:
identifying any of still available coding chunks created and retained by the zone, and
retrieving any of the still available coding chunks distributed to the zone from another zone, and
creating local copies of any of still available original data chunks from which the still available coding chunks were created; and
reconstructing as many unavailable chunks as possible from the still available coding chunks and the still available original data chunks.

16. The data processing system of claim 13, wherein the operations further comprise adding a new data chunk to an incomplete protection group comprising m partial coding chunks.

17. The data processing system of claim 13, wherein the plurality of at least k+m zones into which the distributed storage system is configured is distributed across a geographical area.

18. The data processing system of claim 13, wherein the distributed storage system is a cloud-based storage system accessible over an inter-network.

* * * * *